(12) United States Patent
Kumakura

(10) Patent No.: US 7,201,602 B2
(45) Date of Patent: Apr. 10, 2007

(54) TERMINAL FITTING FOR SURFACE MOUNTING

(75) Inventor: Hideto Kumakura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/384,540

(22) Filed: Mar. 21, 2006

(65) Prior Publication Data

US 2006/0286849 A1  Dec. 21, 2006

(30) Foreign Application Priority Data

Jun. 3, 2005  (JP)  ............................. 2005-164316

(51) Int. Cl.
*H01R 11/20* (2006.01)
*H01R 4/24* (2006.01)

(52) U.S. Cl. ...................... 439/422; 439/877
(58) Field of Classification Search ................ 439/442, 439/422, 877, 421, 423
See application file for complete search history.

(56) References Cited

U.S. PATENT DOCUMENTS 4,564,253 A * 1/1986 Sinclair .................. 439/422
4,669,798 A * 6/1987 Daum et al. ............. 439/423
4,832,620 A * 5/1989 Yamamoto ................ 439/422
5,078,617 A * 1/1992 Gutierrez et al. ......... 439/422
5,137,468 A * 8/1992 Murakami ................ 439/422
6,565,376 B2 * 5/2003 Aoki ........................ 439/422
2004/0137802 A1 * 7/2004 Wendling et al. ......... 439/877

FOREIGN PATENT DOCUMENTS

| JP | 2002-305042 | 10/2002 |
|----|-------------|---------|
| JP | 2002-305050 | 10/2002 |
| JP | 2003-317829 | 11/2003 |

* cited by examiner

*Primary Examiner*—Michael C. Zarroli
(74) *Attorney, Agent, or Firm*—Armstrong, Kratz, Quintos, Hanson & Brooks, LLP

(57) ABSTRACT

A wire connection portion of a terminal fitting to be connected to a cable for surface mounting includes: a bottom wall extended from the electrical contact portion for overlapping with a flat conductor of a cable for surface mounting; crimping blades vertically extended in a staggered fashion from both edges of the bottom wall for sticking into the flat conductor; and transversal projections projecting from the both edges of the bottom wall respectively corresponding to the staggered crimping blades. Outer ends of the transversal projections are disposed more outward from inner walls of the crimping blades at each side of the bottom wall. A gap between the crimping blades extended from both edges of the bottom wall is narrower than a curvature radius of curved portions formed between the crimping blades and the bottom wall.

2 Claims, 5 Drawing Sheets

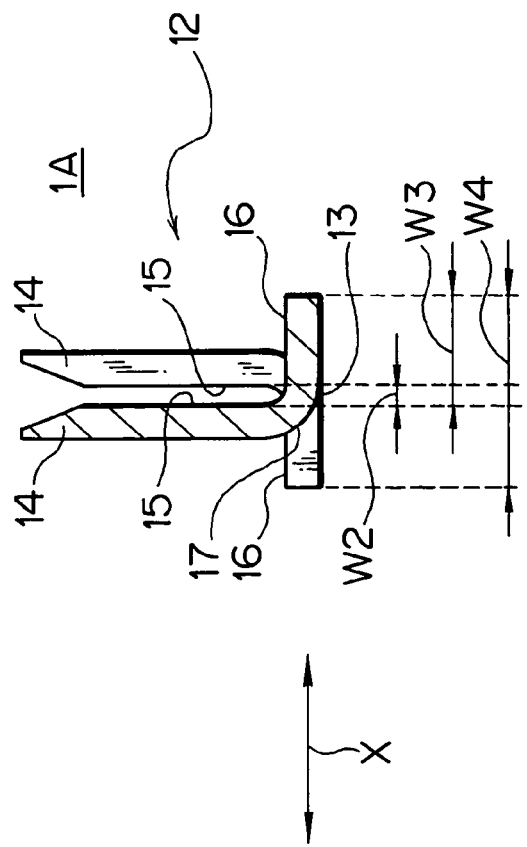
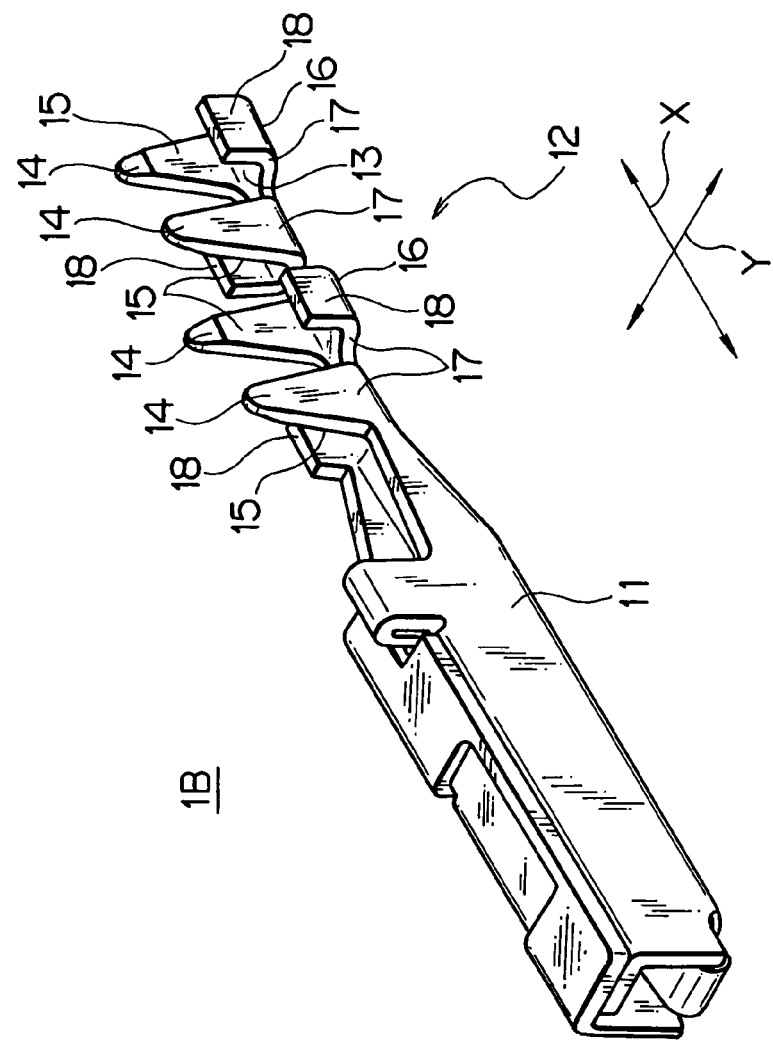
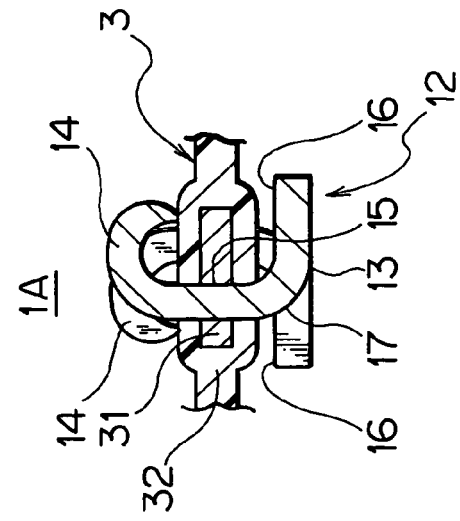

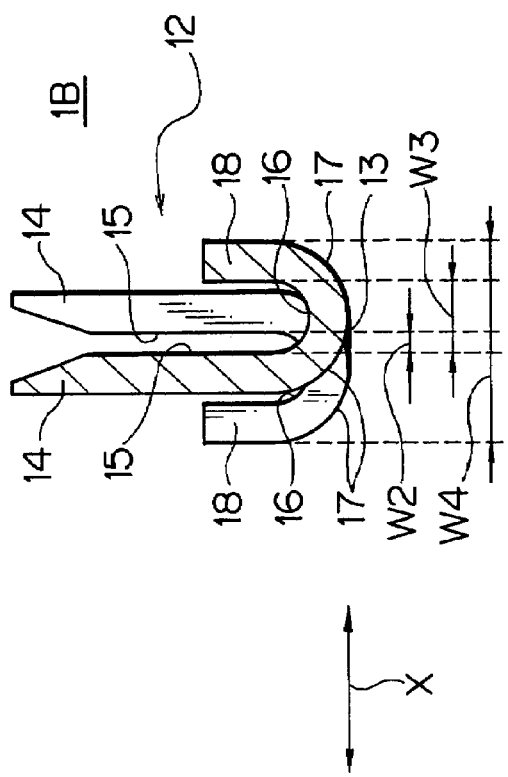
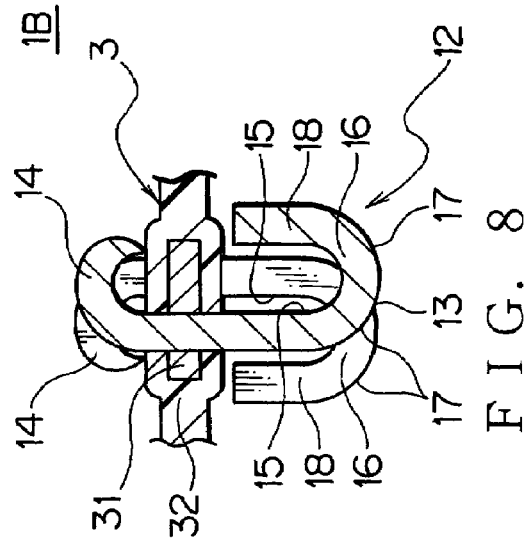
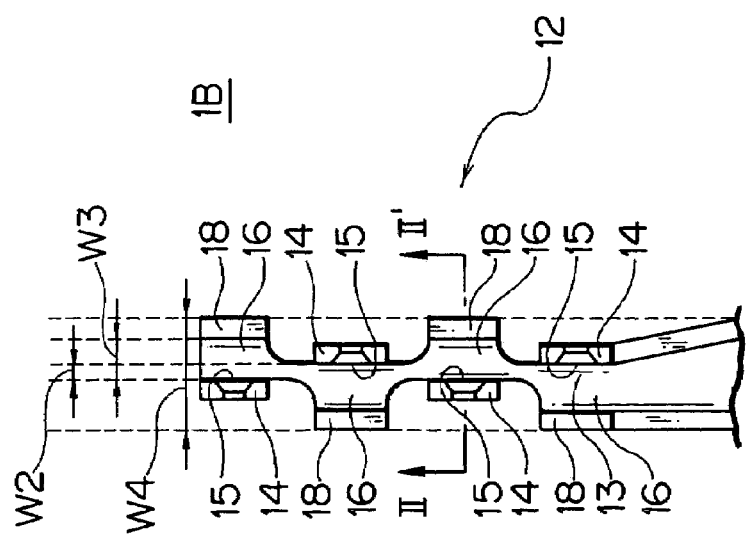
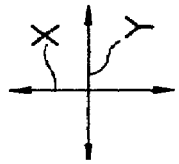

TERMINAL FITTING FOR SURFACE MOUNTING

CROSS REFERENCE TO RELATED APPLICATIONS

This application is based on Japanese Patent Applications No. 2005-164316, the content of which is hereby incorporated by reference.

BACKGROUND OF THE INVENTION

1. Field of the Invention

The present invention relates to a terminal fitting to be connected to flat cables such as FPC (flexible printed circuit) or FFC (flexible flat cable) for surface mounting system.

2, Description of the Related Art

Various electric components are installed on a vehicle. A wire harness is arranged in the vehicle for supplying power or transmitting control signals and the like. The wire harness includes a plurality of wires and connectors. The wire is so-called coated electric wire having a conductive core wire and an insulator coating the core wire.

The connector includes a pair of insulating connector housings engaged with each other and conductive terminal fittings received in the connector housings. The terminal fitting includes: an electrical connection portion attached to an end of the wire for electrically connecting the core wire; and an electrical contact portion for contacting a mating terminal fitting. The connector housings connected to each other allow the wire harness to transmit the signals and the like to the electric components.

Nowadays, as the number of the electric components of the vehicle increases, the number of the wire harnesses increases. Therefore, FPC, FFC and the like (hereafter referred to as "cables for surface mounting") is heavily used.

A terminal fitting 101 in FIG. 9 is well known as a terminal fitting for use in the cables for surface mounting. The terminal fitting 101 includes: an electrical contact portion 111 for being connected to a mating terminal, and a wire connection portion 112 having a bottom wall 113 extended from the electrical contact portion 111 and crimping blades 114 vertically extended from both edges of the bottom wall 113.

The terminal fitting 101 is formed by, for example, bending a metal sheet. The crimping blades 114 are to be bent inward in order to crimp and hold the cables for surface mounting and stick into conductors of the cable. A gap W1 between the crimping blades 114 is narrower than that of the cable for surface mounting. The wire harness is formed by the cables for surface mounting connected to the terminal fittings 101, terminals of which are received in a connector housing.

Incidentally, as the components in a vehicle are mounted in higher density, the width of the cables for surface mounting becomes narrower. Accordingly, the gap W1 between the crimping blades 114 of the terminal fitting 101 reaches the minimum thereof. The minimum width of the gap W1 is at least caused by an existence of a minimum curvature radius between the bottom wall 113 and the crimping blades 114 limited by metalworking technique. Therefore, there is a problem that small sizing of the widths of the cables for surface mounting is limited by the manufacturable size of the terminal fitting 101.

For solving the problem, as shown in FIGS. 10 to 13, some terminal fittings having structures adapted for the cables for surface mounting having narrower widths are already proposed.

A terminal fitting 201 shown in FIGS. 10 and 11 (disclosed by Japanese Published Patent Application No. 2003-317829) includes a rectangular parallelepiped electrical contact portion 211 and a bottom wall 213 for overlapping with a FFC 103. The FFC 103 includes a flat conductor 131 covered by an insulator 132. When the bottom wall 213 overlaps with the FFC 103, the terminal fitting 201 is connected to the FFC 103 through the conductor 131 exposed from sections around a slit A of the FFC 103 and an arched portion of the bottom wall 213.

However, because the FFC 103 and the terminal fitting 201 are not fixed to each other mechanically firmly, there is a problem that connection reliability of the terminal fitting 201 is not high. Further, there is another problem that the exposed conductor 131 of the FFC 103 may be oxidized by the air, and electric resistivity may be increased.

As shown in FIG. 12, a terminal fitting 301 (disclosed by Japanese Published Patent Application No. 2002-305042) includes a rectangular parallelepiped electrical contact portion 311 and a wire connection portion 312 having a bottom wall 313 extended from the electrical contact portion 311 and crimping blades 314 vertically extended from one of edges of the bottom wall 313. Because the crimping blades 314 are disposed solely at the one edge of the bottom wall 313, the crimping blades 314 are allowed to stick into the cables for surface mounting having narrower conductor.

However, because the crimping blades 314 are disposed at the one edge of the bottom wall 313, the terminal fitting 301 is easily inclined. Further, when the crimping blades 314 stick into the cables for surface mounting, the cables for surface mounting are easily moved relative to the terminal fitting 301. Therefore, there is a problem that the connection reliability of the terminal fitting 301 is not high.

As shown in FIG. 13, a terminal fitting 401 (disclosed by Japanese Published Patent Application No. 2002-305050) includes a rectangular parallelepiped electrical contact portion 411 and a wire connection portion 412 having a bottom wall 413 extended from the electrical contact portion 411 and crimping blades 414 vertically extended along the transversal center of the bottom wall 313. The crimping blades 414 are formed by bending twice extended portions of the metal plate transversely from the bottom wall 413.

However, because the crimping blades 414 are vertically extended by bending twice extended portions of the metal plate, there is a problem that mechanical strength of the crimping blades 414, productivity and mechanical accuracy of the terminal fitting 401 are not high.

Accordingly, an object of the present invention is to provide a terminal fitting for connecting to cables for surface mounting having narrow conductors with high connection reliability and high productivity.

SUMMERY OF THE INVENTION

In order to attain the object, according to the present invention, there is provided a terminal fitting including:

an electrical contact portion for being electrically connected to a mating terminal; and a wire connection portion having a bottom wall extended from the electrical contact portion for overlapping with a flat conductor of a cable for surface mounting, crimping blades vertically extended in a staggered fashion on both edges of the bottom wall for sticking into the flat conductor, and transversal projections projecting from the bottom wall respectively corresponding to the staggered crimping blades, said transversal projections of which outer ends being disposed more outward than inner walls of the crimping blades at each edge of the bottom wall.

Preferably, a gap between the crimping blades in a transversal direction of the bottom wall is narrower than a curvature radius of curved portions formed between the crimping blade and the bottom wall.

More preferably, the wire connection portion further has sidewalls vertically extended from outer edges of the transversal projections and respectively facing the crimping blades in the transversal direction of the bottom wall.

These and other objects, features, and advantages of the present invention will become more apparent upon reading of the following detailed description along with the accompanied drawings.

BRIEF DESCRIPTION OF THE DRAWINGS

FIG. 3 is a partially sectional view showing the terminal fitting taken on line I–I' in FIG. 2;

FIG. 4 is a partially sectional view showing the terminal fitting of FIG. 1 being connected to a cable for surface mounting;

FIG. 5 is a perspective view showing the terminal fitting according to a second embodiment of the present invention;

FIG. 6 is a partial plan view showing the terminal fitting of FIG. 5;

FIG. 7 is a partially sectional view showing the terminal fitting taken on line II–II' of FIG. 6;

FIG. 8 is a partially sectional view showing the terminal fitting of FIG. 5 being connected to the cable for surface mounting;

DETAILED DESCRIPTION OF THE PREFERRED EMBODIMENTS

First Embodiment

A terminal fitting 1A according to a first embodiment of the present invention will be described with reference to FIGS. 1 to 4. The terminal fitting 1A is received in a not-shown insulating connector housing made of synthetic resin for electrically connecting a not-shown cable for surface mounting to a terminal fitting received in a mating connector housing.

Figure 1:
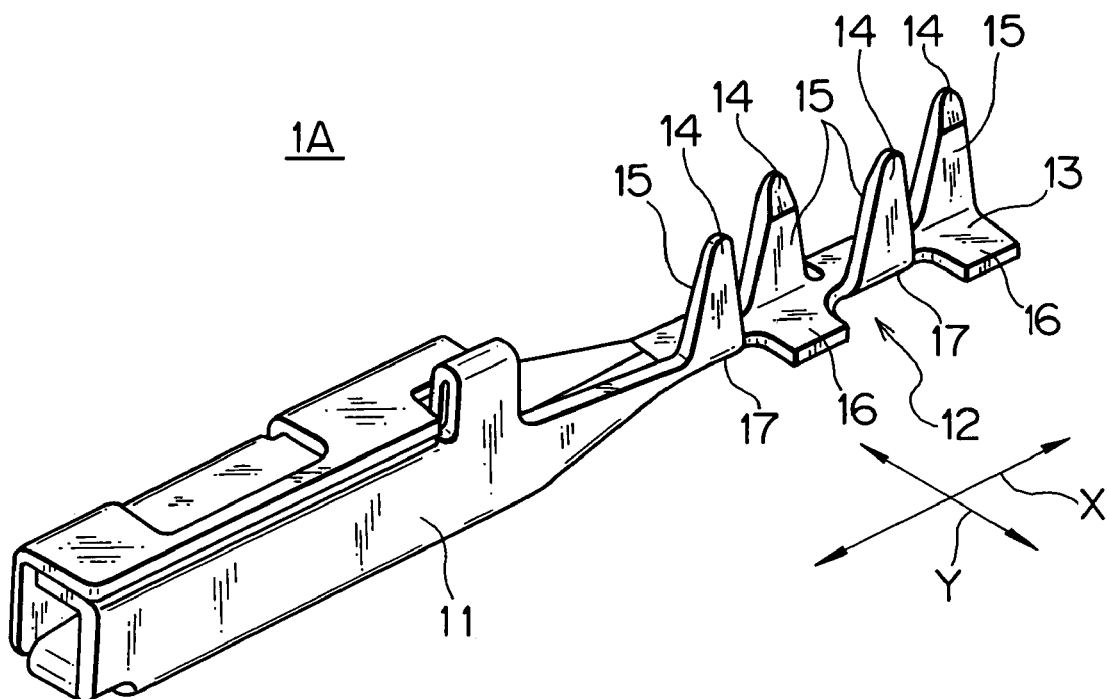
FIG. 1 is a perspective view showing a terminal fitting according to a first embodiment of the present invention.

As shown in FIG. 1, the terminal fitting 1A is formed by bending a metal sheet, and includes: an electrical contact portion 11 for being connected to a mating terminal, and a wire connection portion 12 having a bottom wall 13 extended from the electrical contact portion 11 and crimping blades 14 vertically extended from both edges of the bottom wall 13.

The crimping blades 14 are spaced in two rows in a staggered fashion in a longitudinal direction X of the bottom wall 13. The crimping blades 14 are electrically connected to a conductor of the cable for surface mounting by sticking into an end of the cable.

Figure 2:
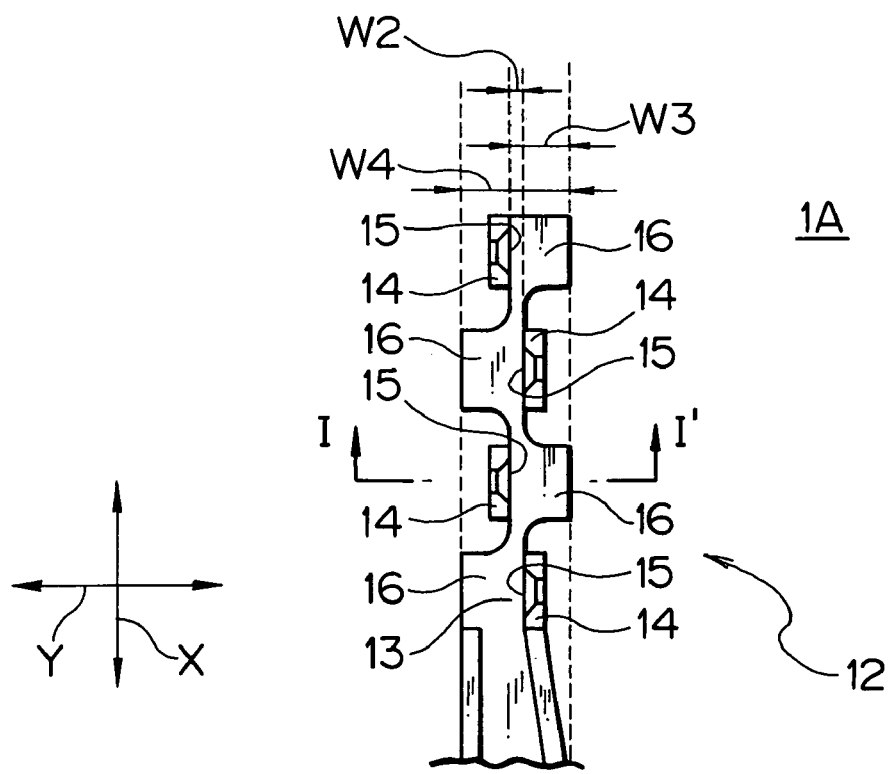
FIG. 2 is a partial plan view showing the terminal fitting of FIG. 1.
Figure 9:
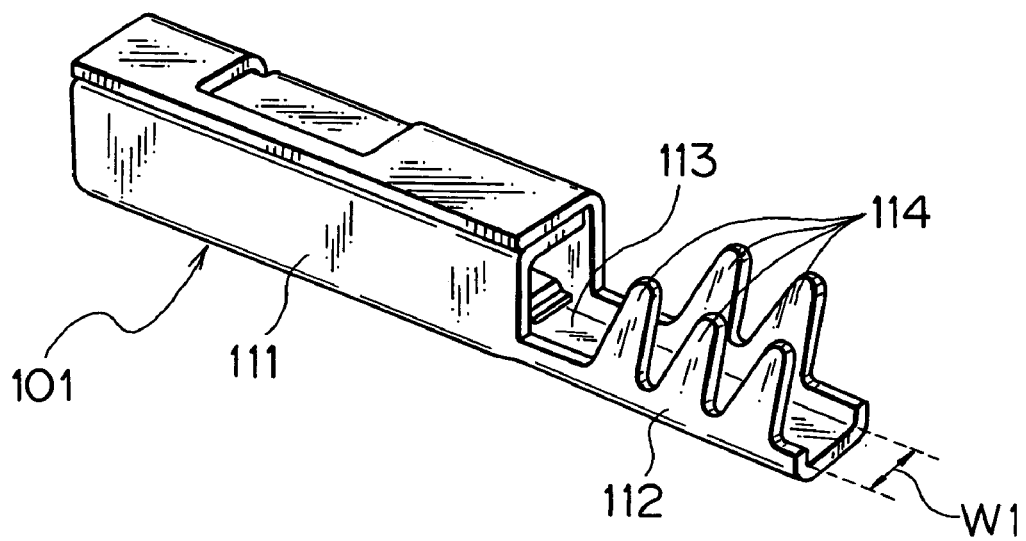
FIG. 9 is a perspective view showing a conventional terminal fitting.
Figure 10:
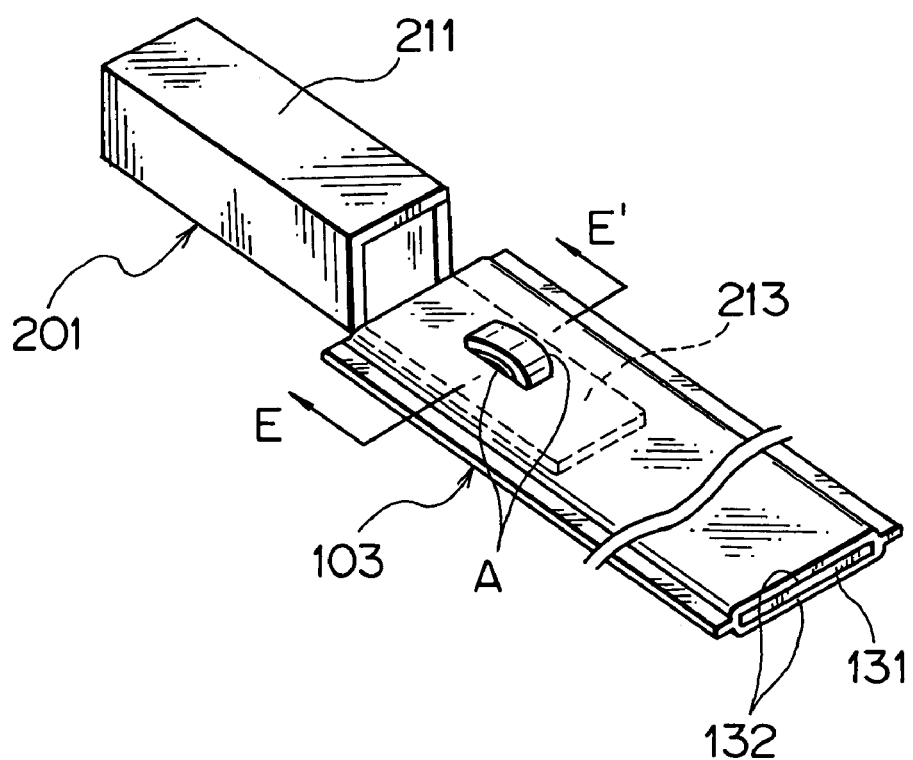
FIG. 10 is a perspective view showing another conventional terminal fitting.
Figure 11:
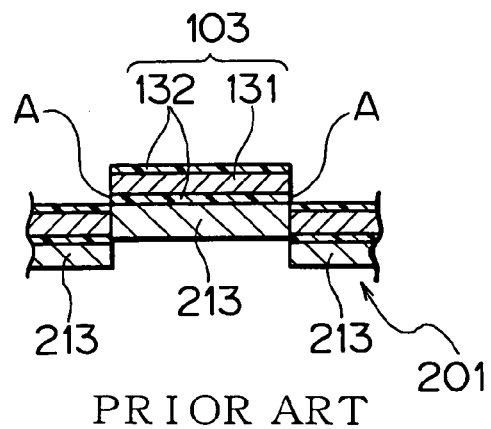
FIG. 11 is a partially sectional view showing the conventional terminal fitting taken on line E–E' of FIG. 10.
Figure 12:
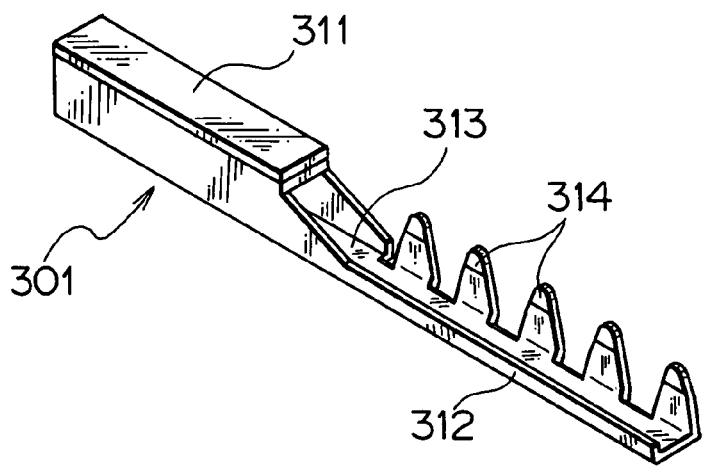
FIG. 12 is a perspective view showing another conventional terminal fitting.
Figure 13:
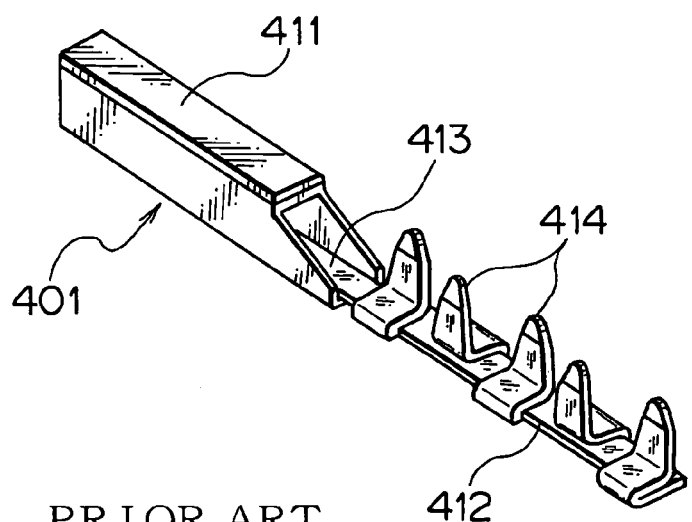
FIG. 13 is a perspective view showing another conventional terminal fitting.

As shown in FIGS. 2 and 3, projections 16 are transversely projected from both edges of the bottom wall 13 in two rows in a staggered fashion. Outer ends of the projection are disposed more outward than inner side walls 15 of the crimping blades 14 at each side of the bottom wall 13.

The projections 16 are extended in a same plane as the bottom wall 13. The projections 16 are flat and the outer ends thereof are not folded.

A gap W2 between the crimping blades 14 in a transversal direction Y is narrower than a curvature radius of curved portions 17 formed between the crimping blades 14 and the bottom wall 13.

A gap W3 between the inner side walls 15 of the crimping blades 14 and the outer ends of the projections 16 is more than the curvature radius of the curved portions 17. However, because the crimping blades 14 are extended vertically in the staggered fashion from both edges of the bottom wall 13, and the outer ends of the projections 16 are disposed more outward than the inner side walls 15 of the crimping blades 14, the gap W2 is formed narrower than the curvature radius of the curved portions 17.

As shown in FIG. 4, the crimping blades 14 in two rows stick perpendicularly into an insulator 32 and a conductor 31 of an FFC 3 as one of the cables for surface mounting. Thereby, the crimping blades 14 are electrically connected to the conductor 31. Then, top ends of the crimping blades 14 are crimped to bend inward and hold the FFC 3. Then, the terminal fitting 1A holding the FFC 3 is received in the not-shown connector housing. Thus, a wire harness is made with high connecting reliability.

According to the terminal fitting 1A of the present invention, the width W3 is a width for bending the crimping blades 14 from the bottom wall 13. Therefore, the width W2 is allowed to be designed freely without constraint of a curvature radius of the curved portions 17. Accordingly, even with the same width W4 of the bottom walls 13, the terminal fitting 1A of the present invention can be connected to the cables for surface mounting having narrower pitched conductors than the conventional terminal fittings can.

Because the top ends of the projections 16 are not folded, whole extended lengths of the crimping blades 14 from the bottom wall 13 are effectively used for connecting the cables for surface mounting. Therefore, the extended length is allowed to be the minimum length for connecting the cables. Accordingly, the terminal fitting 1A can be downsized, and designing flexibility of the terminal fitting 1A increases. For example, the terminal fitting 1A can be designed for reducing electric resistance, or increasing cable-holding power.

As shown in FIGS. 2 and 3, because the top ends of the projections 16 are not folded, and the width W2 is independent from the width W4, the designing flexibility of the terminal fitting 1A in the transversal direction Y is also improved. For example, fitting the width W4 to a width of a cavity of the mating connector housing, in which the terminal fitting 1A is received, prevents a rattle of the terminal fitting 1A in the mating connector housing in the transversal direction Y. Thereby, the connecting reliability against external force is improved.

Because the terminal fitting 1A is simply formed by bending the crimping blades 14 once from the bottom wall 13, strength of the crimping blades 14 are not damaged, and productivity and processing accuracy of the terminal fitting 1A are improved. Further, because the crimping blades 14 in two rows are connected to the cable for surface mounting, the crimping blades 14 stick straight into the cable for surface mounting without inclination, and prevents dislocation of the terminal fitting 1A relative to the cable. Therefore, the connecting reliability is improved.

Second Embodiment

A terminal fitting 1B according to a second embodiment of the present invention will be described with reference to FIGS. 5 to 8. In order to avoid repetitions, the same reference numerals are used for the same components, and only the differences existing in comparison with the first embodiment described above will be explained.

As shown in FIG. 5, side walls 18 of the terminal fitting 1B are extended vertically from outer edges of the transversal projections 16. The side walls 18 face to each other in the transversal direction Y.

As shown in FIGS. 6 and 7, the width W2 of the terminal fitting 1B also is narrower than the curvature radius of the curved portions 17.

The gap W3 between the inner side walls 15 of the crimping blades 14 and side walls 18 is more than the curvature radius of the curved portions 17. However, because the crimping blades 14 are extended vertically in the staggered fashion from the both edges of the bottom wall 13, and the outer ends of the projections 16 are disposed more outward than the inner side walls 15 of the crimping blades 14, the gap W2 is formed narrower than the curvature radius of the curved portions 17.

As shown in FIG. 8, the crimping blades 14 in two rows stick perpendicularly into the insulator 32 and the conductor 31 of the FFC 3 as one of the cables for surface mounting. Thereby, the crimping blades 14 are electrically connected to the conductor 31. Then, the top ends of the crimping blades 14 are crimped to bend inward and hold the FFC 3. Then, the terminal fitting 1B holding the FFC 3 is received in the not-shown connector housing. Thus, the wire harness is composed with high connecting reliability.

According to the terminal fitting 1B of the present invention, the width W3 is the width for bending the crimping blades 14 and the side walls 18 from the bottom wall 13. Therefore, the width W2 is allowed to be designed freely without constraint of a curvature radius for the curved portions 17. Accordingly, even with the same width W4 of the bottom walls 13, the terminal fitting 1B of the present invention can be connected to the cables for surface mounting having narrower pitched conductors than the conventional terminal fittings can.

Because the side walls 18 make the terminal fitting 1B taller than the terminal fitting 1A, the rattle of the terminal fitting 1B in the cavity of the mating connector housing in a height direction is reduced, and the connecting reliability against external force is improved. Further, providing the side walls 18 increases the strength of the terminal fitting 1B, thereby productive yield of the terminal fitting 1B and productivity of the wire harness are increased.

Because the terminal fitting 1B is simply formed by bending the crimping blades 14 and the side walls 18 once from the bottom wall 13, strength of the crimping blades 14 and the side walls 18 are not damaged, and productivity and processing accuracy of the terminal fitting 1B are improved. Further, because the crimping blades 14 in two rows are connected to the cable for surface mounting, the crimping blades 14 stick straight into the cable for surface mounting without inclination, and prevents dislocation of the terminal fitting 1B relative to the cable. Therefore, the connecting reliability is improved.

In the first and second embodiment, the electrical contact portions 11 of the terminal fittings 1A and 1B are rectangular parallel piped female contact portions. However, the electrical contact portion 11 may be a bar-type male terminal portion.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A terminal fitting, comprising:
   an electrical contact portion for being electrically connected to a mating terminal; and
   a wire connection portion having a bottom wall extended from the electrical contact portion for overlapping with a flat conductor of a cable for surface mounting, crimping blades vertically extended in a staggered fashion on both edges of the bottom wall for sticking into the flat conductor, and transversal projections projected from the bottom wall respectively correspondina to the staggered crimping blades, said transversal projections of which outer ends being disposed more outward than inner walls of the crimping blades at each edge of the bottom wall,
   wherein a gap between the crimping blades in a transversal direction of the bottom wall is narrower than a curvature radius of a curved portions formed between the crimping blades and the bottom wall.

2. The terminal fitting as claimed in claim 1,
   wherein the wire connection portion further includes sidewalls vertically extended from outer edges of the transversal projections and respectively facing the crimping blades in the transversal direction of the bottom wall.

* * * * *